United States Patent
Murphy et al.

(10) Patent No.: US 6,617,758 B2
(45) Date of Patent: Sep. 9, 2003

(54) INTEGRATED CHARGE AND VOLTAGE MODE DRIVE CIRCUIT FOR PIEZO ACTUATORS USED IN MASS DATA STORAGE DEVICES, OR THE LIKE

(75) Inventors: Terence J. Murphy, Plano, TX (US); James E. Chloupek, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/681,695

(22) Filed: May 22, 2001

(65) Prior Publication Data

US 2002/0175592 A1 Nov. 28, 2002

(51) Int. Cl.[7] .......................... H01L 41/06; H01L 41/08
(52) U.S. Cl. ..................... 310/323.01; 310/316.01; 310/323.13
(58) Field of Search .................... 310/316.01, 316, 310/317, 318, 323.01

(56) References Cited

U.S. PATENT DOCUMENTS

| | | | |
|---|---|---|---|
| 4,631,429 A | * | 12/1986 | Riebeek ..................... 310/318 |
| 4,735,269 A | * | 4/1988 | Park et al. .................. 175/244 |
| 4,796,503 A | * | 1/1989 | Lin ............................... 84/738 |
| 4,838,084 A | * | 6/1989 | Leopold et al. ............. 374/169 |
| 5,042,299 A | * | 8/1991 | Wells ....................... 73/304 C |
| 5,124,597 A | * | 6/1992 | Stuebing et al. ............ 327/261 |
| 5,821,717 A | * | 10/1998 | Hassan et al. .............. 318/138 |
| 6,083,164 A | * | 7/2000 | Oppelt et al. ................ 600/437 |
| 6,246,152 B1 | * | 6/2001 | Fontanella et al. ......... 310/317 |
| 6,286,922 B1 | * | 9/2001 | Kondou ................... 310/316.01 |
| 6,316,862 B1 | * | 11/2001 | Nakata et al. ......... 310/316.02 |
| 6,373,790 B1 | * | 4/2002 | Fujisawa ..................... 320/134 |

OTHER PUBLICATIONS

L6660 Data Sheet, ST Microelectronics, Dec. 2000.

* cited by examiner

*Primary Examiner*—Nestor Ramirez
*Assistant Examiner*—Julio Gonzalez
(74) *Attorney, Agent, or Firm*—W. Daniel Swayze, Jr.; W. James Brady; Frederick J. Telecky, Jr.

(57) ABSTRACT

A driver (40) for supplying drive signals to a piezo element (48) of a milli-actuator device (21) in a mass data storage device (10) in a charge mode of operation has a first circuit (96, 98) for providing a charging current to a sense capacitor (58) in response to head position control signals. The first circuit is powered by a voltage supply (VM) that is referenced to a substrate potential, or a ground potential (AGND). A second circuit (104, 106) for mirroring a current in the first circuit at a predetermined mirror ratio (1x:Nx) to provide drive currents to the piezo element (48). The substrate potential may be, for example, an analog ground potential. If desired, the integrated circuit may also include a first switch (60) connected to selectively disable the first circuit (96, 98) a second switch (62) connected to selectively provide a feedback path from the second circuit (104, 106) to an input of the second circuit (104, 106). When the first (60) and second (62) switches are selectively operated, the integrated circuit is configured to operate in a voltage mode.

12 Claims, 3 Drawing Sheets

INTEGRATED CHARGE AND VOLTAGE MODE DRIVE CIRCUIT FOR PIEZO ACTUATORS USED IN MASS DATA STORAGE DEVICES, OR THE LIKE

BACKGROUND OF INVENTION

1. Field of Invention

This invention relates in part to improvements in methods and apparatuses for dynamic information storage or retrieval, and more particularly to improvements in methods and circuitry for positioning a transducer for writing or detecting data written onto a spinning data disk, and still more particularly to improvements in circuits for driving piezo-based milli-actuator structures and methods for making same.

2. Background of Invention

Mass data storage devices include well known hard disk drives that have one or more spinning magnetic disks or platters onto which data is recorded for storage and subsequent retrieval. Hard disk drives may be used in many applications, including personal computers, set top boxes, video and television applications, audio applications, or some mix thereof. Many applications are still being developed. Applications for hard disk drives are increasing in number, and are expected further to increase in the future.

In the construction of mass data storage devices, a data transducer, or head, is generally carried by an arm that is selectively radially positionable by a servo motor. Recently, so-called milli-motors, or milli-actuators, have been considered to provide better, or more accurate, position control of the head. A milli-actuator is generally constructed with a piezo element carried by the positionable arm and to which the head is mounted. A current is selectively applied to the piezo element, which causes the piezo element to deform, thereby moving the head a small, controllable amount. This provides a fine adjustment to the position of the head. As track densities become more dense, control of the position of the head becomes more critical. Thus, piezo-based milli-actuators are becoming of increasing importance in the head positioning mechanisms.

At least discrete circuits are available for providing drive signals to milli-actuators to control the position of the head of the device or drive with which the milli-actuator is associated. Typically, the milli-actuator drive circuits operate by supplying a control voltage to the piezo element of the milli-actuator.

Although such voltage mode circuits are relatively easy to build, they have several problems. First, the deformation response of piezo elements generally is highly temperature dependent. Thus, significant temperature compensation or calibration circuitry must be provided to assure accurate head positioning over the range of expected operating temperatures of the drive. Secondly, relatively high voltages are required to operate the piezo elements, which may require relatively large circuit components, and may complicate the overall circuit design. Thirdly, piezo elements generally have strong hysteresis effects.

As a result, charge mode milli-actuator circuits have been proposed. Charge mode milli-actuator circuits typically have a capacitor in series with the piezo element, such that a charge builds up on the capacitor that is proportional to the charge on the piezo element. The change in voltage across the capacitor is measured in a given time, and the product of the measured voltage change times the capacitance of the capacitor equals the charge on the capacitor. This value can then be used to adjust the charge supplied to the piezo element. The charge mode technique is still subject to temperature variations and hysteresis effects, but these effects are substantially reduced, and, as a result, the charge mode of operation is more accurate than the voltage mode of operation. On the other hand, the piezo elements are typically large, having capacitances in the range in the thousands of picofarads. Thus, the capacitor that must be used must be proportionately large. Also, the charge used to charge the capacitor is unavailable for charging the piezo element.

One way in which at least some of these problems in the charge mode of operation have been addressed uses a mirror circuit technique in which the milli-actuator circuit provides a 1X mirror circuit connected to a sense capacitor. An nX mirror circuit mirrors the current in the 1X mirror circuit to drive the piezo element. Thus, as the charge on the capacitor changes, the nX output proportionally changes. Thus, at least the size of the sense capacitor can be reduced.

In the past, such mirror circuit type milli-actuator circuits have been provided as separate integrated circuits in which the full positive and negative piezo element drive voltages are used to power both the 1X and nX mirror circuits. However, such positive and negative supply voltage range cannot be used if the milli-actuator circuit is to be integrated with other circuitry, such as the motor servo circuitry, or the like, since the servo circuitry is generally referenced to ground, and the connections to the full rail potentials cause noise. Also, since the substrate is at ground, ordinarily the negative piezo driving voltages cannot be brought onto the chip.

What is needed, therefore, is a milli-actuator driver circuit that can operate at preestablished voltages other than the full rail voltages of the servo.

SUMMARY OF INVENTION

In light of the above, therefore, it is an object of the invention to provide a milli-actuator drive circuit that has selectable voltage and charge modes of operation that need not operate at the full rail potentials.

It is another object of the invention to provide a milli-actuator drive circuit that has a charge mode of operation that uses a current mirroring technique to monitor a charge on a sense capacitor and for developing current outputs having a predetermined ratio to the monitored charge for delivery to the piezo element of the milli-actuator.

It is an advantage of the invention to provide a drive circuit for a milli-actuator in a mass data storage device, or the like, that can be integrated in an integrated circuit, which reduces the load on the high voltage switching regulator and reduces the number of required external components.

These and other objects, features and advantages will become apparent to those skilled in the art from the following detailed description, when read in conjunction with the accompanying drawings and appended claims.

According to a broad aspect of the invention, an integrated circuit is provided for supplying drive signals to a piezo element of a milli-actuator device in a mass data storage device. The integrated circuit has a first circuit for receiving head position control signals and for providing a charging current to a sense capacitor in response thereto. The first circuit is powered by a voltage supply that is referenced to a substrate potential. A second circuit for mirroring a current in the first circuit at a predetermined mirror ratio to provide drive currents to the piezo element. The substrate potential may be, for example, an analog ground potential.

If desired, the integrated circuit may also include a first switch connected to selectively disable the first circuit and a second switch connected to selectively provide a feedback path from the second circuit to an input of the second circuit. When the first and second switches are selectively operated, the integrated circuit is configured to operate in a voltage mode.

According to another broad aspect of the invention, a milli-actuator driver is provided for positioning a head of a hard disk drive. The driver includes first integrated circuit means for receiving head position control signals and for providing a charging current to an external sense capacitor in response thereto. The first integrated circuit means is powered by a voltage supply that is referenced to a substrate potential. Second integrated circuit means are provided for mirroring a current in the first integrated circuit means at a predetermined mirror ratio to provide drive currents to a piezo element. The substrate potential may be, for example, an analog ground potential.

According to yet another broad aspect of the invention, an integrated circuit is provided for supplying drive signals to a piezo element of a milli-actuator device in a mass data storage device to position a data head thereof. The integrated circuit includes a current mirror, which includes first and second mirror portions. The first mirror portion is configured to receive head position control signals from a head position sensing circuit. The first mirror portion is also configured to provide a first current in response to the head position control signals for connection to a capacitor. The first mirror portion is powered by a voltage supply that is referenced to a substrate potential. The second current mirror portion is configured to mirror the first current at a predetermined mirror ratio. The second current mirror is configured to provide drive currents for connection to the piezo element.

According to yet another broad aspect of the invention, a method is provided for operating a milli-actuator driver for a mass data storage device. The method includes providing a current mirror having first and second current outputs. The first and second current outputs have a ratio of 1X:nX, and the first current output is adapted to be connected to a capacitor. The second current output is adapted to be connected to a piezo element of the milli-actuator. The method also includes providing a supply voltage to at least a first portion of the current mirror that is referenced to a ground voltage.

Each channel of the driver has an operational amplifier with a 1X output driver referenced to AGND and powered off $V_{SUPPLY}$. The amplifier also has two outputs driven from the $V_{PP}$ supply that combine with an external low side mirror driven off $V_{MM}$ supply to provide a 10X current output. The amplifier can support either charge mode or voltage mode operation. To support voltage mode control of the actuator, the 1X output is disabled and the 10X output driver is used in a voltage feedback loop to drive the piezo motor. When charge mode control is required for the actuator, a voltage feedback loop using only the 1X output is used to drive an external capacitor while the 10X output, drives the piezo motor. In charge mode, an OTA error amplifier can be used to provide low frequency compensation of the piezo motor voltage so that the piezo voltage slowly tends toward ground and a high pass transfer function is realized.

The milli-actuator driver works off a single 12V input supply with a plus or minus 10% tolerance. A positive LC DC—DC converter is used to generate the positive high voltage supply, $V_{PP}$. A charge transfer circuit off the $V_{PP}$ converter is used to generate the negative supply and regulation of both supplies is achieved through feedback off the $V_{PP}$ supply.

BRIEF DESCRIPTION OF DRAWINGS

The invention is illustrated in the accompanying drawings, in which.

In the various figures of the drawing, like reference numerals are used to denote like or similar parts.

DETAILED DESCRIPTION

Figure 1:
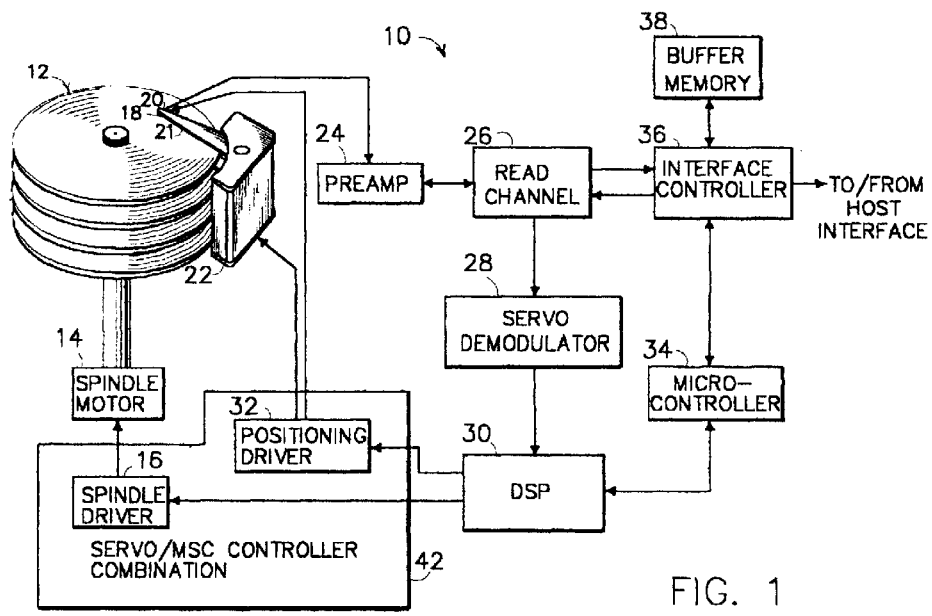
FIG. 1 is a block diagram of a mass data storage device, illustrating the environment of the invention.

FIG. 1 is a block diagram of a generic disk drive system 10, which represents the general environment in which the invention may be practiced. The system 10 includes a magnetic media disk 12 that is rotated by a spindle motor 14 and spindle driver circuit 16. A data transducer or head 18 is locatable along selectable radial tracks (not shown) of the disk 12 by a voice coil motor 22, along a gross radial position. A milli-actuator 20 may be co-located with the head 18 on the end of the arm 21. The milli-actuator is preferably of the type that employs a piezo element in the fine positioning of the head 18, such devices being known in the art. (Although a piezo element type milli-actuator is preferably used, it should be understood that other types of milli-actuator devices may be equally advantageously employed.) The motion of the milli-actuator 20 may be a displacement to the left or right of the axis of the arm 21, to provide fine radial positioning of the head 18 along the track sought to be followed.

The radial tracks may contain magnetic states that contain information about the tracks, such as track identification data, location information, synchronization data, as well as user data, and so forth. The head 18 is used both to record user data to and read user data back from the disk 12. The head 18 also detects signals that identify the tracks and sectors at which data is written, and to detect servo bursts that enable the head 18 to be properly laterally aligned with the tracks of the disk, as known.

Analog electrical signals that are generated by the head 18 in response to the magnetic signals recorded on the disk 12 are preamplified by a preamplifier 24 for delivery to read channel circuitry 26. The servo signals detected from the track being followed are detected and demodulated by one or more servo demodulator circuits 28 and processed by a digital signal processor (DSP) 30 to control the gross and fine positions of the head 18 via a positioning driver circuit 32. In the past, the servo data would that is read and processed has been analog data that has been interpreted by the DSP 30 for positioning the head 12.

A microcontroller 34 is typically provided to control the DSP 30 as well as the interface controller 36 to enable data to be passed to and from the host interface (not shown) in known manner. A data memory 38 may be provided, if desired, to buffer data being written to and read from the disk 18.

Figure 2:
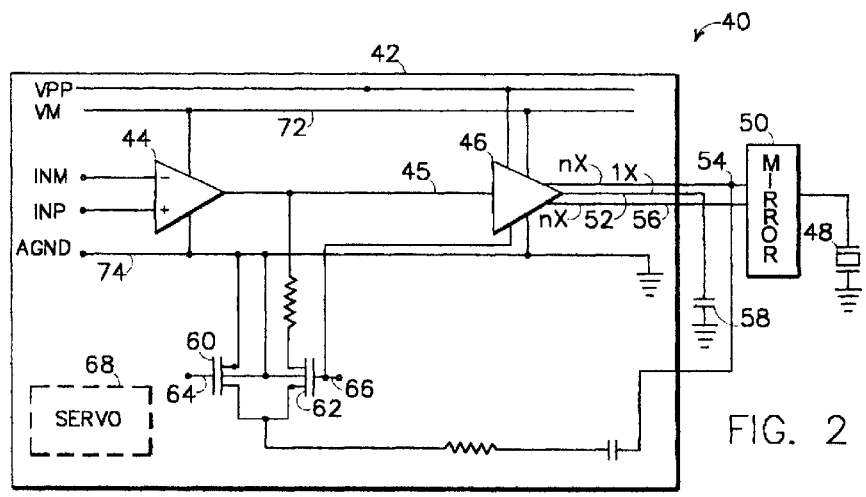
FIG. 2 is an electrical schematic diagram of a portion of the milli-actuator circuit, according to a preferred embodiment of the invention.

FIG. 2 is an electrical schematic diagram of a portion of the positioning driver circuit 32, illustrating the overall structure of a milli-actuator circuit 40, according to a preferred embodiment of the invention. The milli-actuator circuit 40 may be constructed, if desired, on a single integrated circuit chip 42, as shown, together with other associated circuitry, for example, the voice coil driving circuitry and other positioning driver circuitry 32, as well as servo circuitry 68 of the spindle driver 16, and so forth.

The milli-actuator driver circuitry 40 includes two operational transconductance amplifiers (OTAs) stages 44 and 46 to provide milli-actuator driving output signals to control an associated piezo element 48 through an external mirror circuit 50. As will become apparent, the circuit 40 selectively provides either voltage mode or charge mode control of the milli-actuator. The input to the first stage amplifier 44 may be, for example, from a digital to analog converter (not shown) driven by the DSP 30.

The first OTA 44 is preferably operated in Class A mode, while the second OTA 46 is preferably operated in Class AB mode. The output of the second OTA 46 has three outputs, below described in detail, which provide a 1X output 52 to the sense capacitor 58 in charge mode and two nX outputs 54 and 56 to the external current mirror 50. The multiple "n" of the nX outputs may be as needed for the particular application; for example, in one embodiment n may be 10 to provide a 10X output, and in another embodiment n may be 6.125 to provide a 6.125X output.

The mode of the circuit is controlled by two MOS transistors 60 and 62, which have a selection signal applied to their respective gates on lines 64 and 66. When driving the piezo motor in voltage mode, the 1X output 52 of the OTA 46 is disabled and the nX output 54 is used to create a voltage feedback loop through MOS transistor 62. In charge mode, MOS transistor 60 conducts, coupling the nX output 54 to analog ground, AGND 74.

In charge mode operation, a voltage feedback loop is formed with the 1X output driving the external sense capacitor 58, and the piezo element 48 is driven by the nX outputs 54 and 56. The charge delivered to the piezo element is determined by the ratio of the capacitance of the piezo element and the sense capacitance, the nX current drive ratio, and the voltage applied to the OTA 46 from the voltage source VM 72. At this juncture it should be noted that the voltage source VM is referenced to analog ground 74, in contradistinction to positive and negative voltages sources used in the prior art.

The external mirror 50 can be implemented with bipolar or MOS devices that support the output range needed for the particular piezo element 48 employed. Series resistors may be used, if desired, to improve the matching characteristics of the mirror.

Figure 3A:
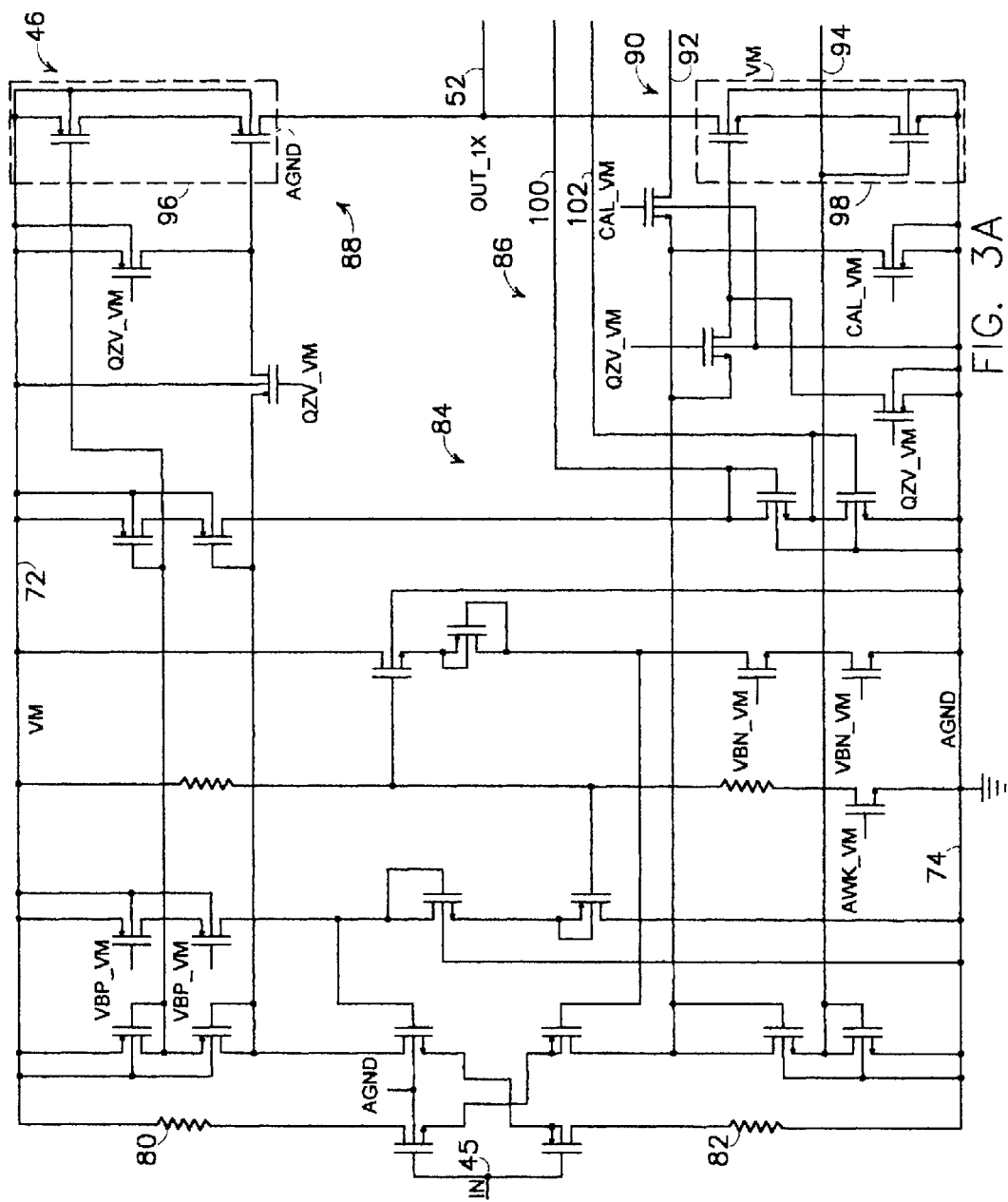
FIGS. 3A and 3B are detailed electrical schematic diagrams showing details of the 1X and nX output drivers of the output amplifier of FIG. 2.

With reference now additionally to FIG. 3, a detailed schematic of the amplifier 46 is shown. The amplifier is implemented with CMOS devices, and, as shown, operated between a predetermined positive voltage, in this case conveniently, VM, and analog ground, AGND. This is in distinction to previous circuits that operated between positive and negative rails of the voltage applied to drive the piezo element. As mentioned, the amplifier 46 is preferably operated in Class AB mode. Thus, input resistors 80 and 82 are provided to limit the Class AB mode current during switch over.

The circuit 46 includes a shut-off circuit 84 that turns off the 1X output and drives it to a high impedance, for example, when the circuit is operated in voltage mode. A calibration circuit 86, as shown, provides inputs to the circuit 46 on lines 92 and 94. The 1X outputs are provided on output line 52 by pull-up and pull-down transistors 88 and 90, which are constructed in wells 96 and 98 that are connected respectively to AGND and VM. Thus, the maximum voltage that is applied across the 1X output driver transistors is the difference between VM and AGND, enabling the transistors of the drivers to be integrated onto the same integrated circuit chip as other components of the motor controlling circuitry. Outputs to the nX driver circuits, shown in detail in FIG. 3B, are provided on output lines 110 and 112.

Figure 3B:
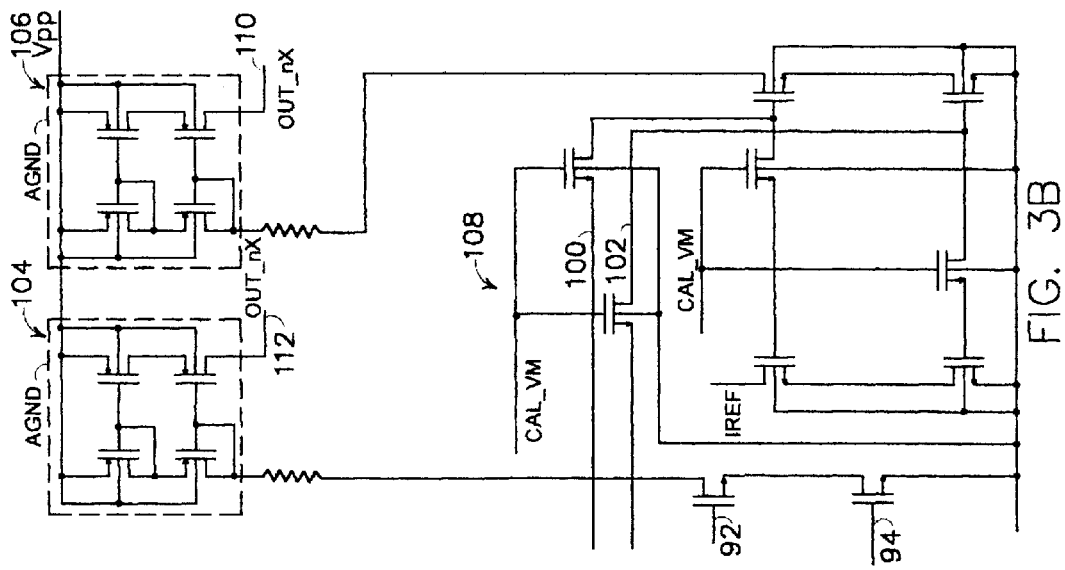

With reference additionally now to FIG. 3B, the details of the nX amplifiers 104 and 106 and the remaining calibration circuitry 108 are shown. It should be noted that the voltage of the nX amplifiers 104 and 106 may be other than the voltage VM of the 1X amplifier; however, they are also referenced to the analog ground potential, AGND.

Figure 4:
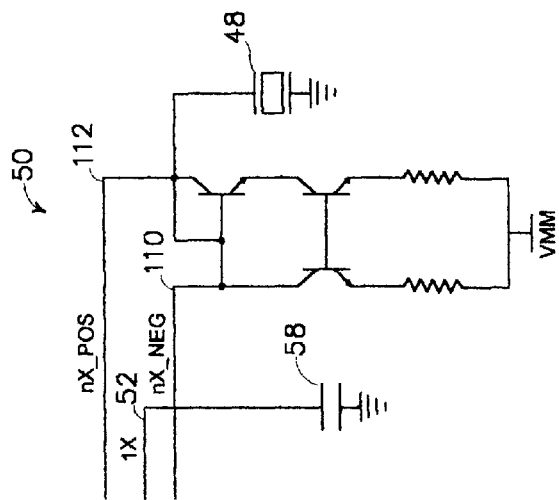
FIG. 4 is an electrical schematic diagram of externally connected components, including a piezo element driving mirror and a charge measuring capacitor for use with the circuit of FIGS. 3A and 3B.

Details of the external mirror 50 and capacitor 58 are shown in FIG. 4, to which reference is now additionally made. The mirror receives the outputs from the nX and 1x drivers on respective lines 110, 112, and 52. The mirror circuit is shown as being constructed of bipolar devices; however, it should be understood that MOS devices may be equally advantageously employed.

It can be seen that through the use of mirrors that are biased to a predetermined voltage with respect to ground, the milli-actuator circuit can be easily integrated in an integrated circuit with the wells containing the driver transistors biased to a substrate ground, which may be the analog ground for the circuit. The integration of these components enables the entire circuit to be combined with other integrated circuitry, such as the motor servo, or other desired circuitry. This results in a reduction on the load on the high voltage switching regulator and reduces the number of required external components.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. An integrated circuit for providing drive signals to a piezo element of a milli-actuator device in a mass data storage device, comprising:

a first circuit for receiving head position control signals and for providing a charging current to a sense capacitor in response thereto;

wherein said first circuit is powered by a voltage supply that is measured with respect to a substrate potential; and a second circuit for mirroring a current in said first circuit at a predetermined mirror ratio to provide drive currants to said piezo element.

2. The integrated circuit of claim 1 wherein said substrate potential is an analog ground potential.

3. The integrated circuit of claim 1 wherein said predetermined mirror ratio is 10:1.

4. The integrated circuit of claim 1 wherein said predetermined mirror ratio is 6.125:1.

5. The integrated circuit of claim 1 further comprising servo circuitry integrated therewith.

6. A milli-actuator driver for positioning a head of a hard disk drive, comprising:

first integrated circuit means for receiving head position control signals and for providing a charging current to an external sense capacitor in response thereto;

wherein said first integrated circuit means is powered by a voltage supply that is referenced to a substrate potential; and second integrated circuit means for mirroring a current in said first integrated circuit means at a predetermined mirror ratio to provide drive currents to a piezo element.

7. The milli-actuator driver of claim 6 wherein said substrate potential is an analog ground potential.

8. The mull-actuator driver of claim 6 wherein said voltage supply is a voltage supply other than a voltage supply for said piezo element.

9. The milli-actuator driver of claim 6 wherein said predetermined mirror ratio is 10:1.

10. The milli-actuator driver of claim 6 wherein said predetermined mirror ratio is 6.125:1.

11. The mull-actuator driver of claim 6 further comprising:

a first switch connected to selectively disable said first integrated circuit; means a second switch connected to selectively provide a feedback path from said second integrated circuit means to an input of said second integrated circuit; means wherein when said first and second switches are selectively operated, said integrated circuit operate sin a voltage mode.

12. The milli-actuator driver of claim 6 further comprising servo circuitry integrated therewith.

* * * * *